United States Patent [19]

Schwartz

[11] 4,405,188

[45] Sep. 20, 1983

[54] ELECTRICAL SOCKET WITH DISCREET IMPEDANCE ELEMENT ATTACHED THERETO

[75] Inventor: William B. Schwartz, New Brunswick, N.J.

[73] Assignee: Akzona Incorporated, Asheville, N.C.

[21] Appl. No.: 251,580

[22] Filed: Apr. 6, 1981

[51] Int. Cl.³ .................... H01R 9/09; H01R 13/66
[52] U.S. Cl. ..................... 339/17 CF; 339/147 R
[58] Field of Search .............. 339/17 C, 17 CF, 19, 339/147 R, 147 P, 18 C, 18 P, 244 R, 97 R, 95 D; 174/52 FP; 361/400, 401, 403-406, 408

[56] References Cited

U.S. PATENT DOCUMENTS

| | | | |
|---|---|---|---|
| 3,060,258 | 10/1962 | Spurgeon | 339/244 R |
| 3,605,062 | 9/1971 | Tinkelenberg et al. | 339/17 CF |
| 3,660,799 | 5/1972 | Tinkelenberg et al. | 339/61 M |
| 3,710,299 | 1/1973 | Weisenberger | 339/17 CF |
| 3,778,745 | 12/1973 | Fischer | 339/18 C |
| 3,880,493 | 4/1975 | Lockhart, Jr. | 339/147 R |
| 3,891,898 | 6/1975 | Damon | 339/147 R |
| 3,900,239 | 8/1975 | Anhalt et al. | 339/17 CF |
| 3,989,337 | 11/1976 | Stelling | 339/90 R |
| 4,004,196 | 1/1977 | Doucet | 361/414 |
| 4,025,148 | 5/1977 | Bouley | 339/176 MP |
| 4,047,780 | 9/1977 | Cedrone | 339/17 CF |
| 4,052,117 | 10/1977 | Tengler et al. | 339/17 CF |
| 4,252,390 | 2/1981 | Bowling | 339/17 CF |
| 4,326,765 | 4/1982 | Brancaleone | 339/17 CF |

FOREIGN PATENT DOCUMENTS

| | | | |
|---|---|---|---|
| 2515199 | 10/1976 | Fed. Rep. of Germany | 361/403 |
| 970226 | 9/1964 | United Kingdom | 339/97 R |

OTHER PUBLICATIONS

IBM Bulletin, Deboskey, vol. 15, No. 3, p. 813, 8-1972.

Primary Examiner—Neil Abrams
Attorney, Agent, or Firm—Francis W. Young; David M. Carter

[57] ABSTRACT

There is provided a dual in-line socket assembly including an insulator block having a plurality of primary holes therein, each hole receiving an electrical socket. The sockets are adapted to receive pins from integrated circuit chips. At least one of the primary holes has a secondary hole or slot drilled adjacent and contiguous thereto for receiving an electrical lead. The electrical lead is connected to a circuit element and the lead forms an interference fit with a corresponding adjacent socket.

6 Claims, 5 Drawing Figures

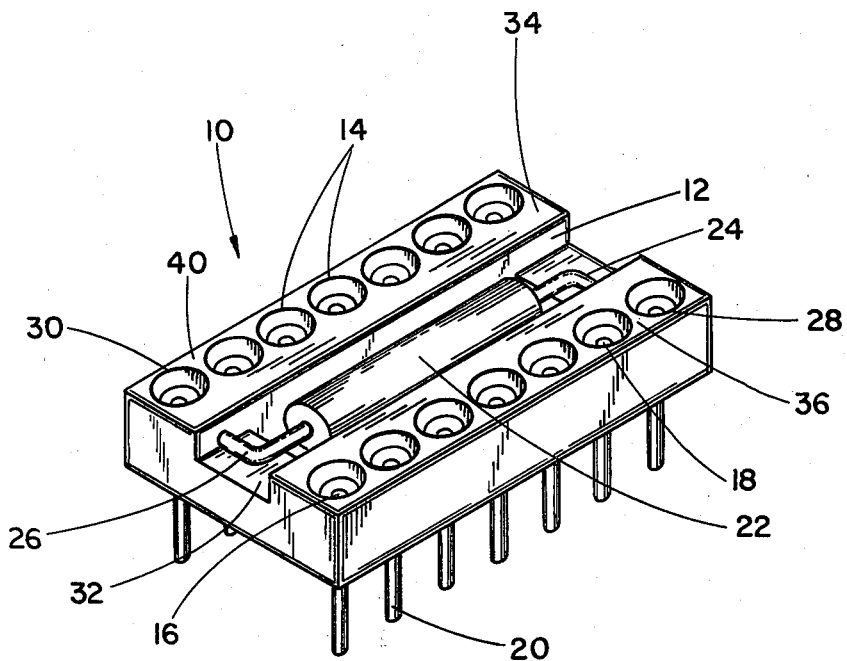
FIGURE 1
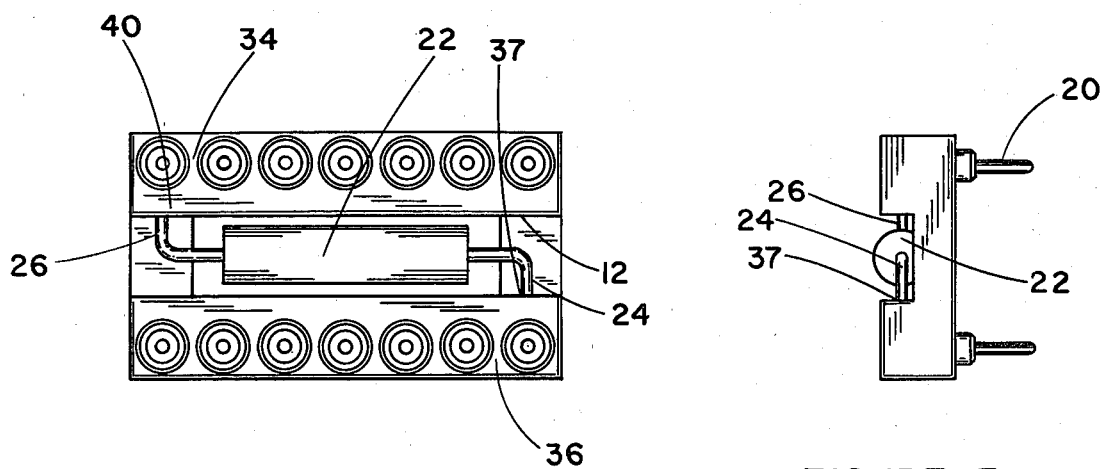
FIGURE 2
FIGURE 3

ELECTRICAL SOCKET WITH DISCREET IMPEDANCE ELEMENT ATTACHED THERETO

BACKGROUND OF THE INVENTION

This invention relates to an improved electrical termination system. More particularly, it relates to a dual in-line socket assembly having electrical circuit elements made integral therewith.

Integrated circuits which are made up of dual in-line packages having a plurality of leads extending therefrom have gained wide acceptance in the electronics industry. These dual in-line packages are normally mounted on a circuit board to make connections to various components. One mechanism which is utilized in mounting dual in-line packages of integrated circuits to circuit boards is through the use of a dual in-line socket assembly which includes a plurality of holes which contain a corresponding plurality of electrical socket contacts. These contacts receive the pins from the dual in-line package integrated circuit.

A typical dual in-line package integrated circuit is described in U.S. Pat. No. 4,004,196, assigned to Augat, Inc. One particular type of dual in-line socket assembly is the Series 610 open frame dual in-line socket manufactured by Garry Manufacturing Company of New Brunswick, N.J. The dual in-line integrated circuits quite often need additional components connected to their terminals to perform certain operations. For example, decoupling capacitors are quite often needed in high speed logic applications; and, furthermore, resistors are often needed to couple the emitters of the transistors in the logic circuit, for example, ECL logic applications.

U.S. Pat. No. 4,004,196, which is previously described, shows two techniques for coupling circuit components such as resistors and capacitors in the dual in-line integrated circuit package. One technique is to wire wrap the resistor or capacitor to the contact terminal extension from the sockets to couple certain sockets together. However, this wire wrap technique for these discrete circuit elements is quite often a rather cumbersome task. Another technique is to utilize a single in-line package adjacent to the dual in-line package integrated circuit with a coupling between the single in-line package and the integrated circuit being one of the conductive planes of the printed circuit board. However, this technique requires additional holes to be drilled in the circuit board to accommodate the single in-line package.

OBJECTS OF THE INVENTION

It is, therefore, one object of this invention to provide an improved electrical termination system.

It is another object of this invention to provide an improved electrical termination system which firmly couples electrical contacts to circuit components.

It is still another object of this invention to provide a dual in-line socket assembly having an electrical component integral therewith.

It is still another object to provide an effective and simple mechanism for terminating electrical components to a insulator block having electrical contacts mounted therein.

SUMMARY OF THE INVENTION

There is provided an electrical termination system including an insulator block having at least one primary hole drilled therethrough. The primary hole receives an electrical contact. Furthermore, there is at least one secondary hole or slot having a portion contiguous with the primary hole. The contiguous portion between the primary and secondary holes are void of insulation. The secondary hole or slot receives an electrical lead. The contact and the electrical lead form an interference fit with one another in the two holes.

BRIEF DESCRIPTION OF THE DRAWINGS

The subject matter which is regarded as the invention is set forth in the appended claims. The invention itself, however, together with further objects and advantages thereof, may be better understood by reference to the following description taken in conjunction with the accompanying drawings, in which:

FIG. 1 is a pictorial view of the electrical termination system incorporating some of the features of the subject invention.

FIG. 2 is a plan view of the termination system shown in FIG. 1.

FIG. 3 is a side elevational view of the termination system of FIG. 1.

DESCRIPTION OF THE PREFERRED EMBODIMENT

Figure 4:
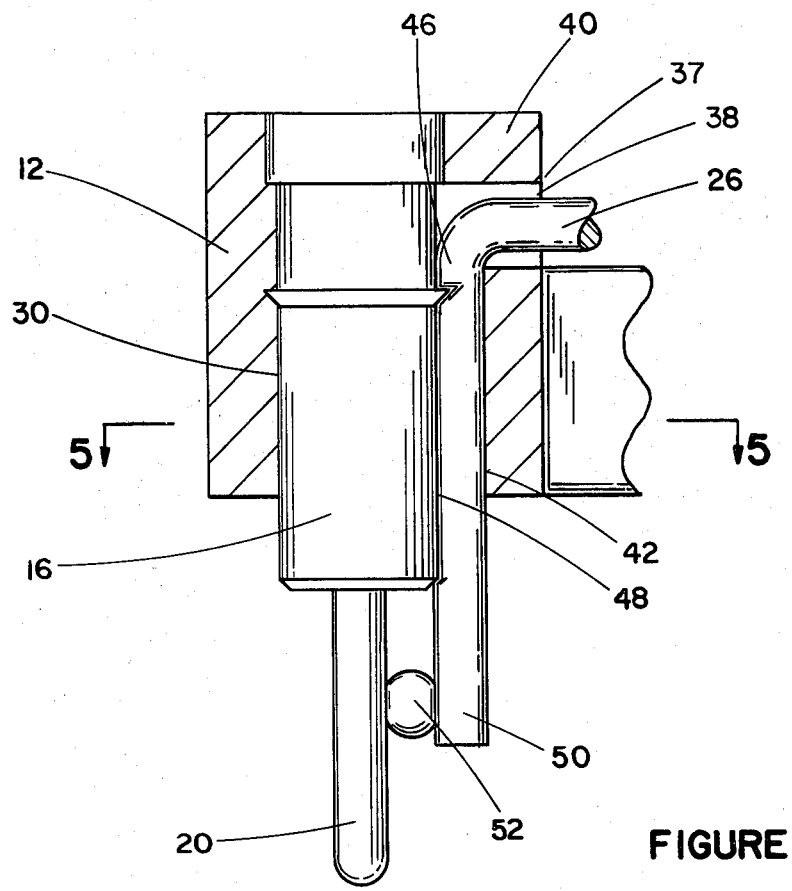
FIG. 4 is an enlarged partial sectional view showing the interference fit between the socket contact and the electrical lead of the termination system of FIG. 1.

Referring now more particularly to FIG. 1, there is provided dual in-line socket assembly 10 including an insulator block 12 having a plurality of primary holes 14 drilled therethrough. The primary holes receive electrical socket contacts 16, which include socket openings 18 and terminal members 20. The socket openings 18 are adapted to receive corresponding pins which protrude from dual in-line package integrated circuits (not shown) such as those described in U.S. Pat. No. 4,004,196. The sockets 16 are normally machines components and made from a hardened brass material.

As previously discussed, the dual in-line package integrated circuits guite often require decoupling capacitors between two of their leads to prevent electrical disturbances as well as for other purposes.

As can be seen from FIG. 1, capacitor 22 is mounted to and then made integral with the dual in-line socket assembly 10. The capacitor includes leads 24 and 26. Lead 24 is terminated to socket 28 and lead 26 is terminated to socket 30.

In this particular construction, the capacitor 22 is mounted in channel 32 of the socket assembly somewhat below the level of the top surfaces 34 and 36 of shoulder 40 of the socket assembly so as to not interfere with the mounting of the dual in-line integrated circuit package. Thus, the capacitor maintains a low profile in the assembly.

Other electrical components, such as resistors, may be similarly mounted on the socket assembly for other electronic purposes. The terminals 20 of the sockets are adapted to be pressed into an array of holes in a circuit board (not shown).

As can be seen from FIGS. 2 and 3, leads 24 and 26 of the capacitor 22 may be inserted into the sides 37 of shoulders 40 and top portions 34 and 36 of the insulator block 12. As can be seen from FIG. 4, a slot 38 is formed in the side 37 of shoulder 40 of the insulator block so that the lead 26, as well as lead 24 on the other side of the insulator block, may enter secondary hole or slot 42 so as to terminate to socket contact 16. A bend 46 in the lead 26 is formed so as to accommodate this termination. The termination occurs all along the area of contact 48 between socket 16 and lead 26. Lead 26 substantially fills all of the volume of hole or slot 42, and socket 16 substantially fills all of the volume of hole 30. Thus, an interference fit between the socket 16 and lead 26 is formed along the area of contact 48.

Figure 5:
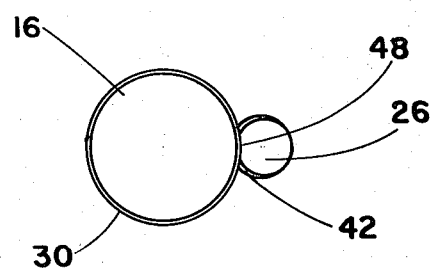
FIG. 5 is a partial sectional view taken through lines 5—5 of FIG. 4 with the insulation material omitted.

Normally, the lead 26 is first inserted into slots 37 and 42, after which the socket 16 is pressed into hole 30. The hard brass socket works the soft copper metal of the lead. Thus, as shown in FIG. 5, the hard brass material will cause the soft copper lead to deform along its area to contact 48 with the socket, thus insuring a gas-tight interference fit between the two, and, furthermore, increasing the surface area of contact between the socket and the lead. The copper lead will conform to the shape of the socket at this area of contact 48.

As can be seen as a result of this termination system for leads 26 and 24, an electrical component, such as a capacitor, is made integral with a dual in-line socket assembly so that no additional wire wrapping or hole drilling in a circuit board is necessary to enable this electrical component to perform its electrical function together with an integrated circuit package.

As can be seen from FIG. 4, the end portion 50 of the lead 26 may be soldered to the terminal portion 20 of the socket as shown by solder material 52. Furthermore, the end portion 50 and the terminal portion 20 of the socket may be flow soldered to the circuit board using this configuration.

From the foregoing description of the illustrative embodiment of the invention, it will be apparent that many modifications may be made therein. It will be understood, therefore, that this embodiment of the invention is intended as an exemplification of the invention only, and that the invention is not limited thereto. It is to be understood, therefore, that it is intended that the impending claims are to cover all the modifications that shall fall within the true spirit and scope of the invention.

I claim:

1. An electrical termination system comprising:
   an insulator block having a pair of primary holes drilled therethrough, said primary holes each receiving an electrical socket contact; said socket contacts each having rigid exterior portions and hollow pin receiving portions located within the confines of said primary holes;
   a secondary hole associated with each primary hole and each secondary hole formed as a bulge extending sidewardly from the periphery of the associated primary hole; a discrete electrical impedance element having a pair of leads; each of said secondary holes receiving a corresponding electrical lead of said impedance element; each of said rigid exterior portions of said contacts and said leads forming an interference fit with one another therebetween, said secondary holes being configured to closely surround the inserted leads.

2. An electrical termination system as set forth in claim 1, further including a plurality of primary holes and a plurality of electrical contacts.

3. An electrical termination system as set forth in claim 2, wherein a dual in-line integrated circuit package is adapted to be received in said plurality of socket contacts.

4. An electrical termination system as set forth in claim 1, wherein said impedance element is a capacitor.

5. An electrical termination system as set forth in claim 1, wherein said electrical contact substantially fills at least the cross-section of said primary hole and said lead substantially fills at least the cross-section of said secondary hole.

6. An electrical termination system as set forth in claim 1 wherein each of said contacts includes a terminal portion and each of said leads includes a terminal portion, the respective terminal portions being coupled to one another.

* * * * *